(12) United States Patent
Blaszczyk et al.

(10) Patent No.: US 6,172,523 B1
(45) Date of Patent: Jan. 9, 2001

(54) APPARATUS AND METHOD FOR CONVERTING A NON-LOGIC-FAMILY SIGNAL LEVEL TO A LOGIC-FAMILY SIGNAL LEVEL

(75) Inventors: Martin Blaszczyk, Villa Park, IL (US); Vincent E. Bridge, Basking Ridge, NJ (US); Daniel E. Radke, Oklahoma City, OK (US); Brent E. Taylor, Batavia, IL (US); Michael Zurat, Bridgewater, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/163,431

(22) Filed: Sep. 30, 1998

(51) Int. Cl.[7] .................................... H03K 19/082
(52) U.S. Cl. .................. 326/63; 326/89; 326/75
(58) Field of Search ................. 326/63, 75, 76, 326/89, 90

(56) References Cited

U.S. PATENT DOCUMENTS 4,931,672 * 6/1990 Khan ........................... 326/90
5,434,518 * 7/1995 Sinh et al. ..................... 326/84
5,859,545 * 1/1999 Thornblad ..................... 326/90
5,877,633 * 3/1999 Ng et al. ....................... 326/80

OTHER PUBLICATIONS

"Undervoltage Sensing Circuit, MC 34064, Data Sheet," pp. 1–8, 1996.*

* cited by examiner

*Primary Examiner*—Michael Tokar
*Assistant Examiner*—Don Phu Le

(57) ABSTRACT

A system and method for translating a non-logic-family signal level into a logic-family signal level, the system comprising: a source of a non-logic-family signal that can assume a first and a second non-logic-family state; and a translator for determining whether the signal is in the first non-logic-family state, and if so, providing a translated signal having a first-logic family level. The translator can take the form of a comparator controlling an output transistor tied to a pull-up resistor, or a programmed processor. Examples of the logic-families include transistor-transistor logic (TTL) and complimentary metal oxide semiconductor (CMOS) logic. Examples of sources of non-logic-family signals includes a light emitting diode, a buzzer and a beeping device.

20 Claims, 2 Drawing Sheets

APPARATUS AND METHOD FOR CONVERTING A NON-LOGIC-FAMILY SIGNAL LEVEL TO A LOGIC-FAMILY SIGNAL LEVEL

FIELD OF THE INVENTION

The invention is directed toward an interface method and apparatus for digital logic, and more particularly a method and apparatus for interfacing a source of non-logic-family signal levels to a circuit that requires signals to conform to the specifications of a logic-family.

BACKGROUND OF THE INVENTION

In many technologies, e.g., telecommunications, diagnostic circuitry is employed. Often, such diagnostic circuitry only takes the form of a warning light, such as a light emitting diode (LED), and/or an auditory indicator, e.g., a buzzer or beeping device. In the event that a predetermined condition arises, the LED and/or buzzer is energized to provide a warning.

As the demands upon such technology and the environments in which they are used change, such diagnostic technology sometimes becomes insufficient. For example, a device might have originally been placed in a quiet and/or rather dimly lit environment. However, changing demands might place this device in a brightly lit and/or noisy environment where a blinking LED and/or faint buzzer might go unnoticed.

Alternatively, it might be desired to remotely gather data based upon the state of such an LED or buzzer for improved monitoring purposes.

SUMMARY OF THE INVENTION

It is an advantage of the invention to be able to translate a non-logic-family signal level into a logic-family-signal level, e.g., in order to augment the output of an indicator such as an LED or buzzer or to remotely collect data based upon the state of such an indicator.

These and other advantages of the invention are achieved by providing a system for translating a non-logic-family signal level into a logic-family signal level, the system comprising: a source of a non-logic-family signal that can assume a first and a second non-logic-family state; and a translator for determining whether said non-logic-family signal is in said first non-logic-family state, and if so, providing a translated signal having a first logic-family level.

These and other advantages of the invention are also achieved by providing a converter for converting a non-logic-family signal level to a logic-family signal level comprising: a comparator for comparing a level of a non-logic family signal with a reference value to determine whether said signal is in said first or said second non-logic-family state; an output transistor controlled by said comparator; and a pull-up resistor connected between an output terminal of said output transistor and a supply voltage set according to a logic-family high signal level.

These and other advantages of the invention are also achieved by providing a method of translating from a non-logic-family signal level into a logic-family signal level, the method comprising: comparing a level of a non-logic-family signal with a reference value to determine whether said signal is in a first or second non-logic-family state; and causing, when said first non-logic-family signal level is detected, an input to a logic-family device to take a first logic-family state.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 1:
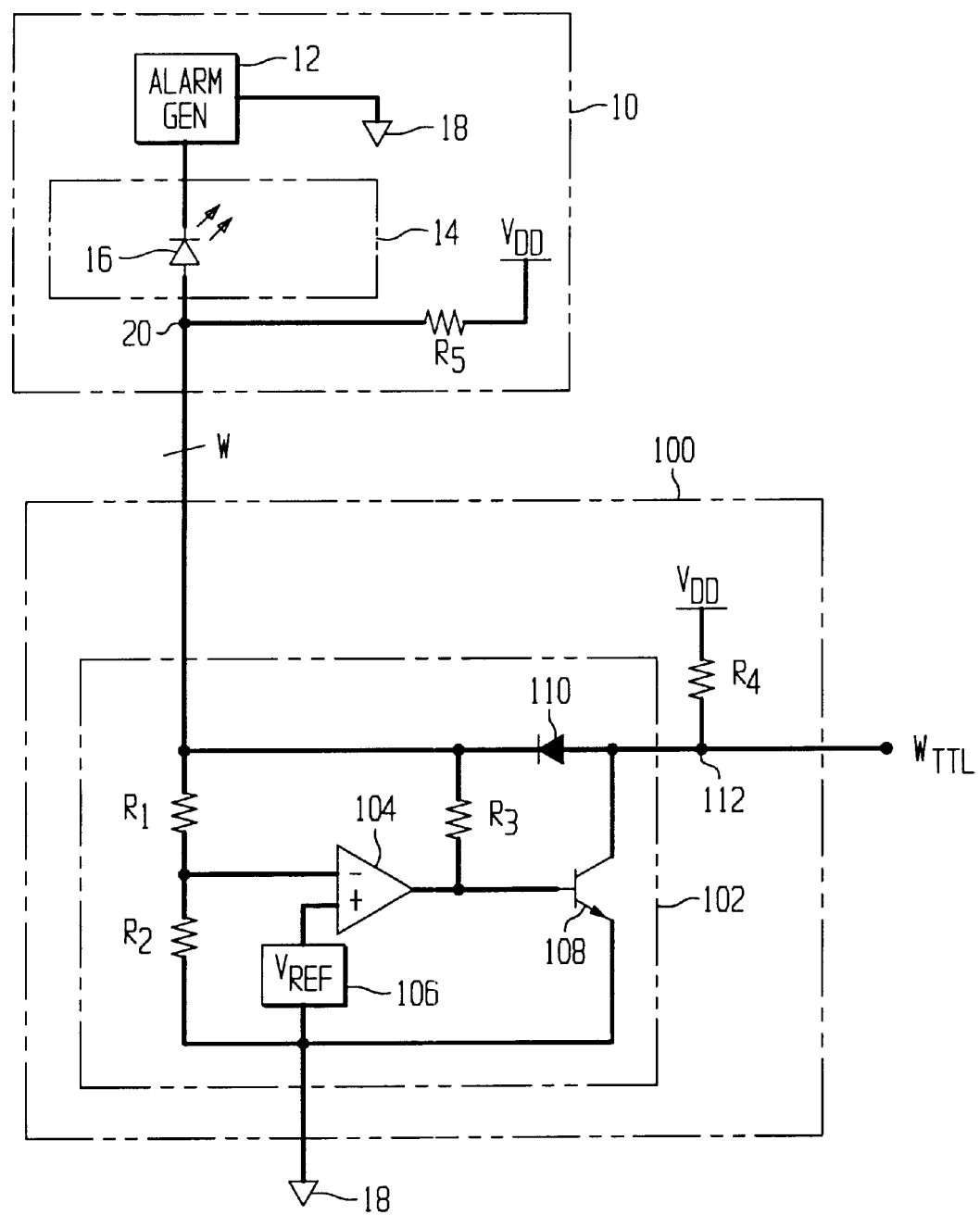
FIG. 1 is a block diagram of a first embodiment of the invention.

FIG. 1 is a block diagram of a first, and preferred, embodiment of the invention. In FIG. 1, a source 10 of a non-logic-family signal W is connected to a translator 100 which translates the non-logic-family signal, W, into a logic-family signal, e.g., transistor-transistor-logic (TTL) such that the output of the translator 100 is $W_{TTL}$.

The non-logic-family signal source 10 includes an alarm generator circuit 12 connected to an indicator 14. The indicator 14 is connected to the translator 100 at a node 20. Also, a resistor $R_5$ is connected between the node 20 and a source of voltage, $V_{DD}$. The indicator 14 is depicted as a light emitting diode, LED 16. Alternatively, the indicator can be a buzzer or beeping device (such as a piezo element). The signal on the node 20 is a warning signal, W.

The translator 100 includes an undervoltage sensing integrating circuit 102 that receives the warning signal W and outputs a translated signal, e.g., $W_{TTL}$, at an output terminal 112. The output terminal 112 is also connected to the source of voltage, $V_{DD}$, via a resistor $R_4$. The magnitude of the voltage $V_{DD}$ is selected to be sufficient to establish a logical high signal level for the desired family of logic, e.g., five volts for TTL.

An example of the undervoltage sensing integrated circuit (IC) 102 is the MC33064 model of undervoltage sensing integrated circuit marketed by either Motorola Incorporated or Linfinity. The undervoltage sensing integrated circuit 102 includes a comparator 104, the non-inverting input of which is connected to a voltage reference source 106 providing a reference voltage $V_{ref}$. The voltage source 106 is connected to the relative system ground 18. The inverting input of the comparator 104 is connected to the node 20 via resistor $R_1$ and to the relative system ground 18 via a resistor $R_2$. The output of the comparator 104 is connected to the node 20 via a resistor $R_3$. The node 20 is also connected to the cathode of a diode 110, the anode of which is connected to the output terminal 112 of the IC 102. The output terminal 112 also is connected to the collector of a bipolar junction transistor (BJT) 108, the emitter of which is connected to the relative system ground 18, and the base of which is connected to the output of the comparator 104.

Figure 2:
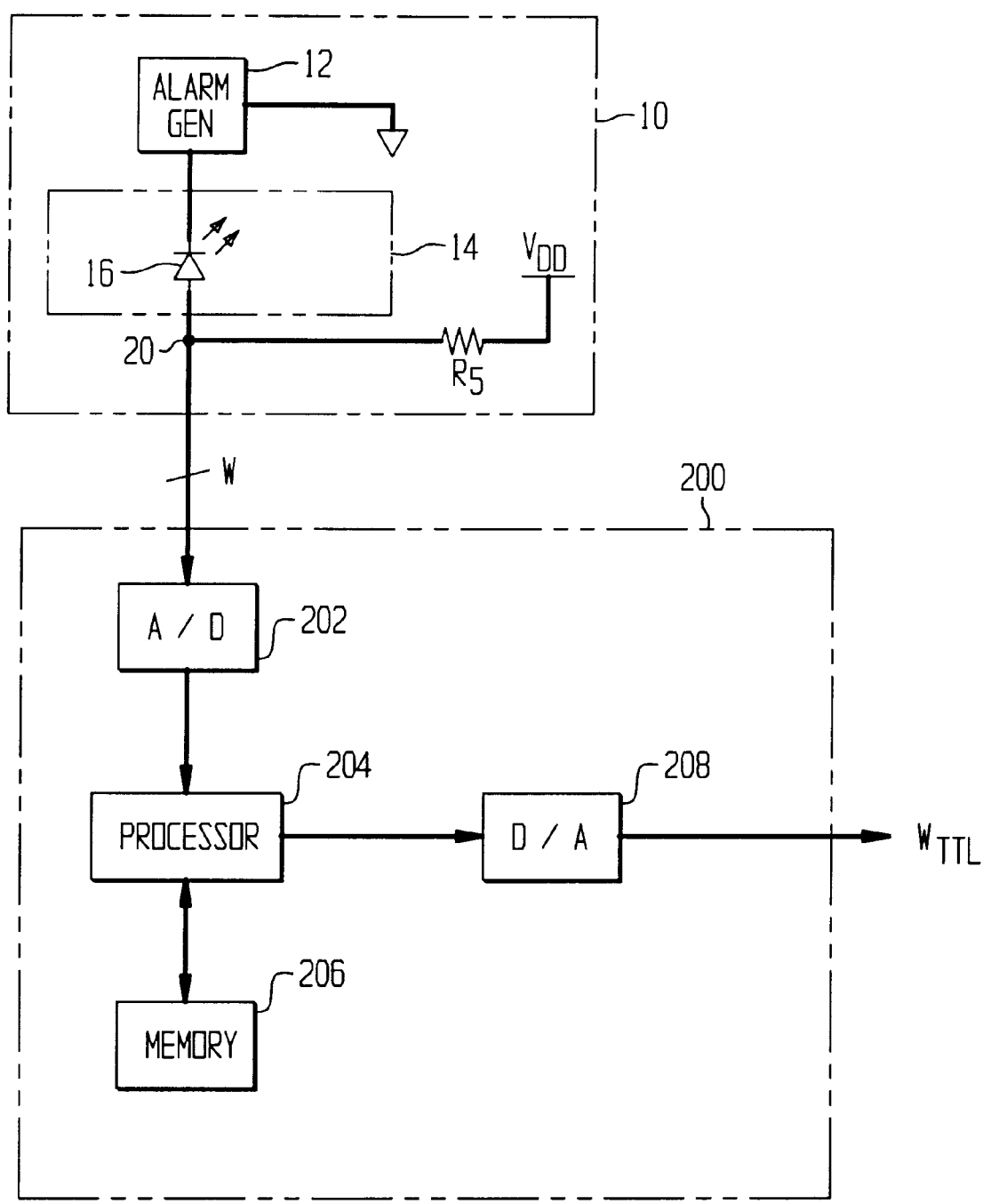
FIG. 2 is a block diagram of a second embodiment of the invention.

FIG. 2 is a block diagram depicting a second embodiment of the invention. FIG. 2 differs from FIG. 1 in that the translator 100 has been replaced by an alternative translator 200. The translator 200 includes an analog to digital (A/D) converter 202 that is connected to the node 20 and so receives the indicator signal W. The digitized signal is provided to a processor 204, which is bidirectionally connected to a memory 206. The processor provides a digital representation of a logic-family signal level to a digital to analog (D/A) converter 208. The D/A converter 208 provides the analog translated signal, e.g., $W_{TTL}$.

The operation of the invention will now be explained in terms of the embodiments described above.

When the indicator 14 is implemented by the LED 16, rather than a buzzer or beeping device, and when the LED 16 is not emitting (not activated) then a voltage on the node 20 is typically 5 volts. However, when the LED 16 is emitting light (activated), then the voltage on the node 20 can typically take a voltage in the range of 2 and 4 volts, but nominally is about 3 volts. Thus, an emitting (activated) LED has a logical low state characterized by a voltage between 2 and 4 volts while a non-emitting (inactive) logical high state of the LED is characterized by a voltage of 5 volts. These voltage levels are incompatible with the voltage levels for the standard logic families, which include TTL, emitter-couple logic (ECL), N-type oxide semiconductor (N-MOS) logic and complementary metal oxide semiconductor (C-MOS) logic. If one desires to interface the LED 16 with, e.g., TTL logic in order to drive a supplemental indicator or gather data from a remote location, then it is necessary to translate the non-logic-family signal levels of the LED 16 into the TTL family-logic levels. The translator 100 does this as follows.

The translator 100 is an implementation of the recognition that an LED 16 is inactive if the voltage on node 20, i.e., the signal W, is approximately 5 volts. Thus, a voltage of 5 volts on the node 20 is treated as a logical high state. While it is true that the that the logical low state of the LED 16 can be determined by assessing whether the signal W is between 2 and 4 volts, this is a more complicated determination and so the determination of the logical high state is preferred.

The IC 102 determines whether the signal W is greater than 4.6 volts. The resistance values of the resistors $R_1$ and $R_2$ are selected such that the voltage on the inverting comparator 104 corresponds to the reference voltage 106 in such a way that the threshold of the undervoltage sensing IC 102 is set at 4.6 volts.

If the signal W is greater than 4.6 volts, then the comparator 104 outputs a low signal, which turns off the BJT 108. When the BJT 108 is turned off, then the terminal element 112 of the IC 102 takes the voltage $V_{DD}$ corresponding to the logical high state of the logic family, which is 5 volts for TTL logic. Thus, $W_{TTL}$=5 volts when W is greater than 4.6 volts. However, when the LED 16 is emitting, W is between 2 and 4 volts, i.e., W is less than 4.6 volts. When W is less than 4.6 volts, the comparator 104 outputs a high signal, which turns on the BJT 108. When turned on, the BJT 108 provides a path to relative system ground 18 so that the voltage on the terminal element 112 drops to the level of the relative system ground, which for TTL is approximately 0 volts such that $W_{TTL}$=0.

The translator 200 of FIG. 2 digitally implements the algorithm inherent to the translator 100 of FIG. 1. The analog signal W on node 20 is digitized by the A/D converter 202. The digital representation of W is compared by the processor 204 to a reference value, e.g., 4.6 volts, stored in the memory 206. The bi-directional connection between the memory 206 and the processor 204 permits the reference value to be changed. Alternatively, the memory 206 could be formed in some type of read-only memory.

If the processor 204 determines that the digital version of the signal W is greater than 4.6 volts, then the processor outputs a digital representation of the TTL high signal, i.e., 5 volts to the D/A converter 208. The D/A converter 208 converts the digital representation from the processor 200 into the analog signal $W_{TTL}$=5 volts. Similarly, if the level of signal W on node 20 is less than 4.6 volts, then the processor outputs a digital representation of the low signal for TTL, i.e., 0 which is converted to analog by the D/A converter 208 such that $W_{TTL}$=0.

The embodiments have been discussed in terms of translating the non-logic-family signal into TTL signals. However, the non-logic-family signal could be converted into signal levels appropriate for CMOS, N MOS, ECL or any other logical signal definition.

The embodiment of FIG. 1 is preferred because it is simple and economical to implement especially in view of the commercial availability of the undervoltage sensing circuit 102. However, the individual components of the IC 102 could be implemented discreetly, or as noted the translator 100 of FIG. 1 could be implemented as the processor-based translator 200 of FIG. 2.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A system for translating a non-logic-family signal level into a logic-family signal level, the system comprising:
   an illumination indicator or auditory indicator representing a source of a non-logic family signal that can assume a first and a second non-logic-family state; and
   a translator for determining whether said non-logic-family signal is in said first non-logic family state, and if so, providing a translated signal having a first logic-family level.

2. The system of claim 1, wherein said translator includes:
   a comparator for comparing a level of said a non-logic-family signal with a reference value to determine whether said signal is in said first or second non-logic-family state;
   an output transistor controlled by said comparator; and
   a pull-up resistor connected between an output terminal of said output transistor and a supply voltage set according to a logic-family high signal level.

3. The system of claim 2, wherein:
   said output transistor is controlled to be off or on when said comparator determines said non-logic-family signal to be in said first or second non-logic-family state, respectively;
   a voltage on said output terminal takes a first logic-family state when said output transistor is off; and
   said voltage on said output terminal takes a second logic-family state when said output transistor is on.

4. The system of claim 2, wherein said family of logic is transistor-transistor logic (TTL) and said reference value is 4.6 volts.

5. The system of claim 2, wherein said comparator and said output transistor are formed on a single integrated circuit.

6. The system of claim 1, wherein said family of logic is one of transistor-transistor logic (TTL), emitter-coupled logic (ECL), N-type metal oxide semiconductor (NMOS) logic and complimentary metal oxide semiconductor (CMOS) logic.

7. The system of claim 6, wherein said logic family is TTL.

8. The system of claim 1, wherein when said first non-logic-family state is a logical high signal level, then said first logic-family state is a TTL logical high signal level, and when said second non-logic-family state is a logical low signal level, then said second logic-family state is a TTL logical low signal level.

9. The system of claim 1, wherein said translator includes:
- an analog to digital converter (ADC) operable to receive said signal;
- a programmed computer, responsive to said ADC, for comparing a digitized version of said non-logic-family signal with a reference value to determine whether said signal is in said first non-logic-family state, and, if so, providing a digital signal representing a first logic-family signal level; and
- a digital to analog converter (DAC) operable to provide said translated signal by converting said digital signal representation of said first logic-family signal level into an analog signal.

10. The system of claim 1, wherein said illumination indicator is a light emitting diode (LED).

11. The system of claim 1, wherein said auditory indicator is a buzzer device or a beeping device.

12. The system of claim 11, wherein said auditory indicator is a piezo device.

13. A method of translating from a non-logic-family signal level into a logic-family signal level, the method comprising:
- selecting an illuminating indicator or an auditory indicator as a source of a non-logic-family signal that can assume a first and a second non-logic-family state;
- comparing a level of said non-logic-family signal from said source with a reference value to determine whether said signal is in first or second non-logistic-family state; and
- causing, when said first non-logic-family signal state is detected, an input to a logic-family device to take a first logic-family state.

14. The method of claim 13, further comprising:
- causing, when said second non-logic-family signal state is detected, said input to said logic-family device to take a second logic-family state.

15. The method of claim 13, wherein said family of logic is one of transistor-transistor logic (TTL), emitter-coupled logic (ECL), N-type metal oxide semiconductor (NMOS) logic and complimentary metal oxide semiconductor (CMOS) logic.

16. The method of claim 15, wherein said logic family is TTL.

17. The method of claim 16, wherein when said first non-logic-family state is a logical high signal level, then said first logic-family state is a TTL logical high signal level, and when said second non-logic-family state is a logical low signal level, then said second logic-family state is a TTL logical low signal level.

18. The method of claim 13, wherein said illumination indicator is light emitting diode (LED).

19. The method of claim 13, wherein said auditory indicator is a buzzer device or a beeping device.

20. The method of claim 19, wherein said auditory indicator is a piezo device.

* * * * *